United States Patent [19]

Behfar-Rad

[11] Patent Number: 5,132,983
[45] Date of Patent: Jul. 21, 1992

[54] OPTICAL LOGIC USING SEMICONDUCTOR RING LASERS

[75] Inventor: Abbas Behfar-Rad, Wappinger Falls, N.Y.

[73] Assignee: Cornell Research Foundation, Inc., Ithaca, N.Y.

[21] Appl. No.: 676,514

[22] Filed: Mar. 28, 1991

Related U.S. Application Data

[62] Division of Ser. No. 524,444, May 17, 1990, Pat. No. 5,031,190.

[51] Int. Cl.$^5$ ............................................. H01S 3/083
[52] U.S. Cl. ......................................... 372/94; 372/8
[58] Field of Search ...................... 372/94, 75, 8, 92

[56] References Cited

U.S. PATENT DOCUMENTS

| | | | |
|---|---|---|---|
| 3,408,131 | 10/1968 | Kapany | 331/94.5 |
| 3,430,160 | 2/1969 | Kosonocky | 350/96 |
| 3,431,437 | 3/1969 | Kosonocky | 307/312 |
| 3,585,413 | 6/1971 | Nakagome | 307/312 |
| 3,599,019 | 8/1971 | Nannichi | 307/312 |
| 3,984,785 | 10/1976 | Riseberg et al. | 331/94.5 M |
| 4,720,309 | 1/1988 | Deveaud et al. | 148/33.1 |
| 4,851,368 | 7/1989 | Behfar-Rad et al. | 437/129 |
| 4,924,476 | 5/1990 | Behfar-Rad et al. | 372/94 |
| 5,031,190 | 7/1991 | Behfar-Rad | 372/94 |

*Primary Examiner*—James W. Davie
*Attorney, Agent, or Firm*—Jones, Tullar & Cooper

[57] ABSTRACT

Optical logic circuits utilize laser segments responsive to external optical signals to produce predetermined outputs in accordance with a desired logic function. Each segment has plural laser cavity legs joined at angled junctions to form at least part of a closed ring, with each segment including at least one light emitting, or exit, facet and at least one internally reflective facet at junctions of corresponding cavity legs. In a one-segment laser, the plural cavity legs form a closed ring. The laser is energized to propagate light in both directions around the ring, and external controls in the form of input light signals or reflective facets adjacent to a partially transmitting facet of the laser segment force unidirectional propagation to produce corresponding changes in the direction of emitted light from the laser. Multiple segments may be interconnected to produce more complex logic functions. In a multi-segment device, legs forming an internally reflective junction for a first ring are connected to legs forming an internally reflective junction for a second ring, with these two junctions being omitted so that light propagated in one ring travels into the second. The light-emitting facets for each segment are retained, so that a single segment device has a single set of emitting facets, a two-segment device has two sets of emitting facets, and so on, with the joined segments forming a closed, multi-segment path representing a selected logic function.

16 Claims, 5 Drawing Sheets

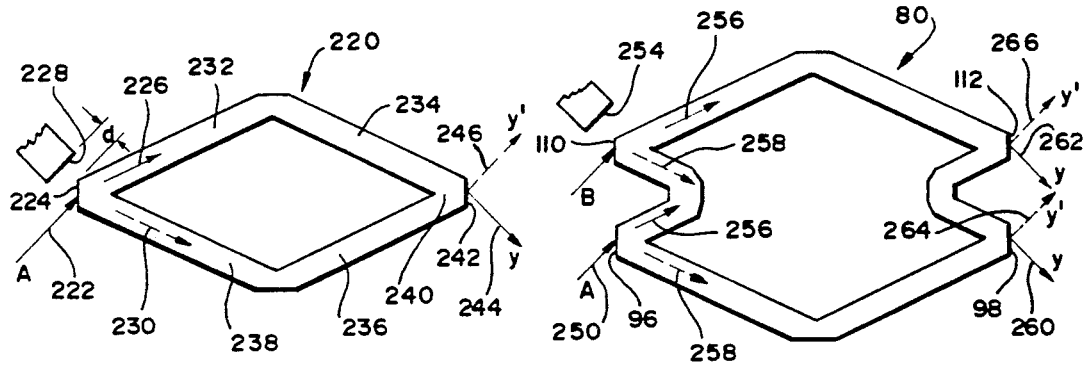
FIG. 12 NOT
FIG. 13 NOR
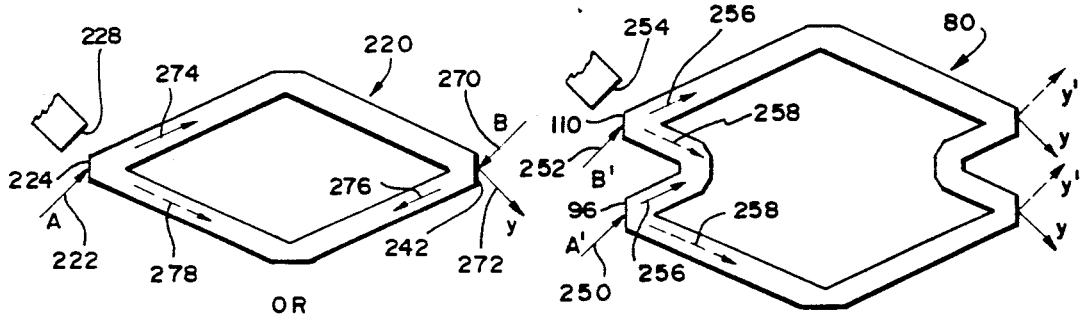
FIG. 14 OR
FIG. 15 NAND and AND
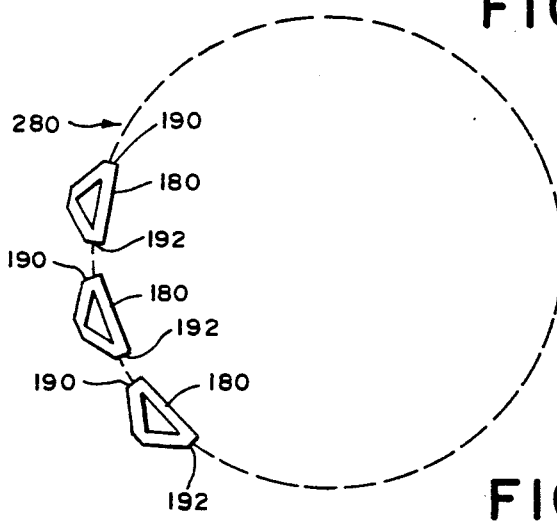
FIG. 16

OPTICAL LOGIC USING SEMICONDUCTOR RING LASERS

This is a division of Ser. No. 07/524,444 filed on May. 17, 1990, now U.S. Pat. No. 5,031,190.

BACKGROUND OF THE INVENTION

The present invention relates in general, to optical logic systems, and more particularly to interconnected semiconductor ring lasers responsive to selected optical inputs to produce corressponding optical logic outputs.

The general concept of utilizing active light elements for achieving logic is generally based upon the discrimination between the presence and absence of laser oscillation. Laser flip-flop devices having two stable states which makes them suitable for use in information storage have been known for many years, but for such devices to serve as logic elements, a number of similar active elements must be combined. This creates difficulties which the prior art has tried to solve in a variety of ways. For example, U.S. Pat. No. 3,599,019 approaches the problem by providing a laser device having three or more stable states. A laser oscillator and an element having a non-linear absorption coefficient are combined, in accordance with this patent, so as to make it possible to select the presence or absence of light oscillation as well as the light propagation direction. Suitable detectors are provided to measure the light produced by the laser device.

Another approach is illustrated in U.S. Pat. No. 3,585,413 which provides an optical logic circuit which includes a plurality of bistable laser flip-flops divided into groups which are connected in cascade. The plural groups are pumped by two-phase pumping inputs which are successively switched at overlapped periods so that the cascade arrangement carries out binary logic operations.

U.S. Pat. No. 3,984,785 discloses another optical logic device in which the direction of polarization of a laser output is used as the logic building block.

Electronic solid circuits have reached a high state of development, but as these circuits approach their limits of speed and size, logic based on photons, rather than electrons, becomes increasingly attractive, for such systems are capable of operating at or near the speed of light, and are immune from the capacitive and resistive problems associated with electronic circuits. The logic elements described in the foregoing patents have attempted to take advantage of these benefits, but suffer from such problems as fan-out and switching speed, and according they have not been completely satisfactory.

SUMMARY OF THE INVENTION

In accordance with the present invention, a photon-based logic system makes use of semiconductor ring lasers and operates by switching the direction of propagation of light within the laser devices rather than by switching them on and off, to thereby provided unitary logic arrays that avoid the losses of prior optical logic systems. Briefly, the present invention is directed to a multi-segment, semiconductor ring laser array wherein the laser segments are arranged to provide selected logic functions. The ring lasers are preferably of the single lateral mode kind. Two examples of single lateral mode lasers are the ridge laser and the narrow-width laser. The ridge laser process is based on U.S. Pat. No. 4,851,368,assigned to the assignee of the present application. The narrow-width laser is formed through the use of cavity widths of about one-half the wavelength of the laser light inside the semiconductor laser. The narrow-width laser process is also based on the above patent.

As described in the aforementioned patent, a ring-type laser has at least three cavity legs joined at three apexes, at which facets are provided, wherein the light within the laser device propagates along a triangular path. Two of the apexes incorporate facets which receive light at an angle greater than the critical angle of the facet so that they are fully internally reflective. The third apex includes a facet which receives light at a preselected angle less than the critical angle so that a portion of the laser light is internally reflected and the remaining incident light is transmitted out of the laser. The angular relationship of the cavity legs with the three facets is selected by the designer. The facets are formed, in accordance with that patent, by an etching process which permits accurate selection of the angular relationship of the facets and the light propagating in the laser body. Although the patent describes a triangular laser structure, structures having more than three legs, or lasing elements, can be provided.

As described for broad-area lasers in U.S. Pat. No. 4,851,368, laser light is generated in the laser body by the application of an electrical potential transversely across the legs of the ring laser, with this laser light being propagated around the ring laser in both clockwise and counterclockwise directions to produce corresponding exit beams of laser light at the transmissive facet. Considering the single lateral mode lasers, the laser light may propagate in either the clockwise or counter clockwise directions.

In accordance with the present invention, multi-segment laser arrays are provided by joining two or more single-segment laser devices, to thereby produce a unitary structure in which the segments cooperate to provide desired logic functions. The direction of propagation of laser light in each segment in the multi-segment array determines the logic state of that segment. Each segment is controlled by its structure and its inputs. The inputs can cause a change in the direction of the propagation of the laser light and, therefore, change the resultant output. Thus, the output light from a first segment passes to the input of a second segment, the output of which is supplied to subsequent sections to produce an array output optical signal representative of the logic function of the array. The directional control of propagation in each segment may be accomplished by means of an input such as a triggering or injection-locking, light source which preferably is a laser. Alternatively, control may be by means of reflector surfaces such as facets positioned in or adjacent to the laser array at selected laser element junctions.

Ring laser segments are formed, in accordance with the invention, by interconnecting cavity legs through totally or partially reflective facets. Selected portions of the propagated light in each segment are transmitted through an exit facet where the presence or absence of light, due to selective changes of light propagation direction within the segment, represents the logic functions response to the particular input condition. This exit light may be passed on to a next adjacent segment which also directs selected parts of the propagated light to an exit facet, again in accordance with the received optical signal, and its output may be used to indicate the logic function of the two segments in combination. This output may, if desired, be supplied to a still further segment, and so on. The output from the total array represents the logic function of that array in response to the input.

A single ring laser segments, as described in U.S. Pat. No. 4,851,368, is a closed polygonal unitary path wherein the ring is made up of a plurality of linear light-emissive elements, or legs, interconnected at their ends by means of unitary junctions incorporating intergrally formed facets. The ring segment may be made up of three elements to form a triangular segment, or four or more elements to form other geometric segment shapes, but in each case the junction between adjacent linear elements includes a mirror surface, or facet, which directs propagated light from one element to the next around the closed path or which transmits at least a part of the light out of the laser device. Preferably, such facets are formed on the laser body with the angle of incidence of propagating laser light onto each facet determining whether the light is reflected internally or is partially or fully transmitted through the facet to provide an output. Accordingly, the light output from such a ring laser is predetermined by the structure of the device.

In accoddance with the present invention, however, the direction of propagation of the laser light in the ring laser segment is controlled. One way to control the direction of propagation of the laser light is to position a structure such as a reflective facet near an output facet of the ring laser segment. The reflective facet is positioned such that its surface is perpendicular to the path of emergence of a potential output beam from the output facet. Thus reflective facet reflects a portion of any potential output beam corresponding to a first propagation direction back into the ring laser segment with a direction corresponding to the second direction of propagation, thereby causing the second direction of propagation to be a favored direction. With the ring laser segment being a single lateral mode laser, the favored direction of propagation will be the only direction of propagation.

A second technique for controlling the direction of propagation is to inject laser light into the ring laser segment so that the injected light travels in the preferred direction. This injected light causes the ring laser segment to favor propagation in the selected direction and tends to suppress propagation in the opposite direction. Either of these two techniques can be used, or both can be used together. At least one of the facets of the ring laser segment is an exit facet which is at least partially transmissive to the laser light travelling either clockwise or counterclockwise, and by detecting the intensity of the light output from each direction of propagation, the logic function of the segment is determined, By forming a plurality of interconnected segments so that the controlled output from one segment is used as the controlling input to the next or so that a plurality of control inputs can be provided to produce selected outputs, a unitary, multi-segment logic array is provided, wherein selected inputs produce selected outputs from multiple possible outputs in accordance with the logic function defined by the structure of the multiple segments.

BRIEF DESCRIPTION OF THE DRAWINGS

The foregoing, and additional objects, features and advantages of the present invention will become apparent to those of skill in the art from a consideration of the following detailed description of preferred embodiments thereof, taken in conjunction with the accompanying drawings, in which:

FIG. 12 is a diagrammatic illustration of a semiconductor ring laser operating as a NOT logic gate;

FIG. 13 is a diagrammatic illustration of a two-segment semiconductor ring laser operating as a NOR logic gate;

FIG. 14 is a diagrammatic illustration of a semiconductor ring laser operating as an OR logic gate;

FIG. 15 is a two-segment semiconductor ring laser operating as either a NAND or an AND logic gate;

FIG. 16 is a diagrammatic illustration of a ring oscillator based on an odd number of NOT semiconductor ring laser elements utilizing the structures of FIGS. 9, 10, or 11; and FIGS. 7a-17d illustrate the key steps in the fabrication of a narrow-width laser.

DESCRIPTION OF PREFERRED EMBODIMENTS

Figure 1:
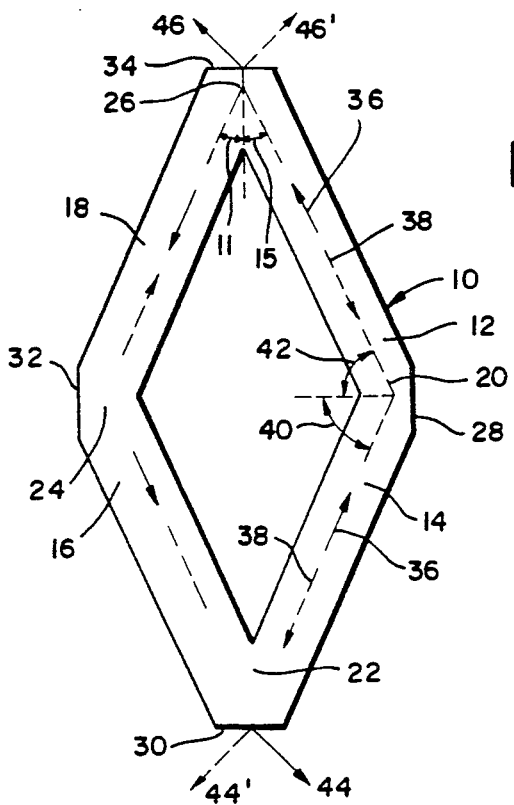
FIG. 1 is a top view of a simple semiconductor ring laser.
Figure 2A:
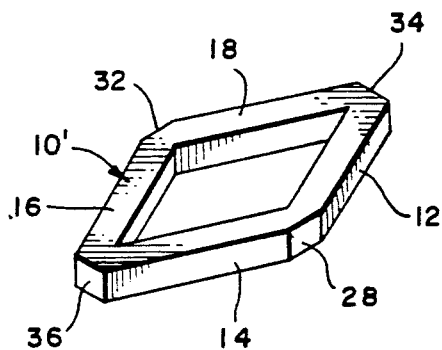
FIG. 2a is a top perspective view of the semiconductor ring laser of FIG. 1, wherein the laser is the narrow-width type.
Figure 2B:
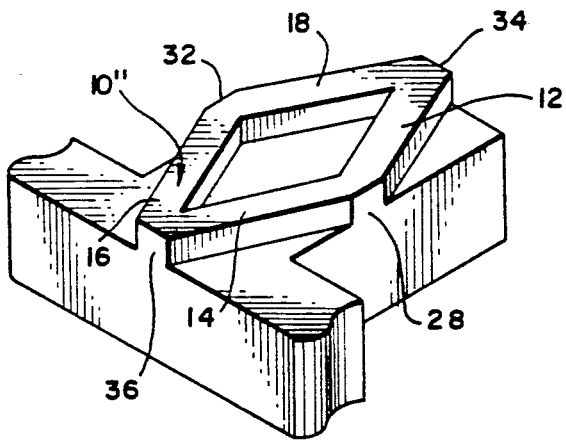
FIG. 2b is a top perspective area of the semiconductor ring laser of FIG. 1, wherein the laser is of the ridge type.

Turning now to a more detailed description of the present invention, there is illustrated in diagrammatic form in FIG. 1 a one-segment ring laser having a semiconductor body portion 10 which includes four cavity leg sections 12, 14, 16 and 18 interconnected to form a closed cavity. The lasers are preferably the signal lateral mode type, examples of which are illustrated in FIG. 2(a), which shows a narrow-width semiconductor ring 10' and in FIG. 2(b), which shows a semiconductor ring ridge laser".

The adjacent cavity sections of laser 10 are integrally joined at junctions 20, 22, 24, and 26, with the junctions each incorporating facets such as those illustrated at 28, 30, 32 and 34, respectively. The surfaces of the facets are optically smooth to reflect the internally created optical travelling waves, these waves being generally indicated by the solid-line arrows 36 travelling in a counterclockwise direction as illustrated in FIG. 1 and the dashed-line arrows 38 travelling in a clockwise direction. The lasing action may create optical waves in both directions if the laser allows more than one lateral mode. If the laser is of the single lateral mode type, it will only allow a single direction of propagation, either in the clockwise or counterwise direction.

As is known, a reflective surface such as a facet formed on a semiconductor cavity section will transmit a substantial portion of the light energy which strikes the facet at an angle perpendicular to its surface, while a small percentage of that light energy will be reflected back along the path of the impinging light. However, light impinging on the surface of the facet at an internal angle away from the perpendicular will have a larger portion of its energy reflected and will provide a lower amount of emergent light. At a certain transition angle, which will depend upon the refractive indices of the materials on opposite sides of the facet, the incident light will be totally internally reflected. The angle at which this occurs is the critical angle. Light striking the surface at an angle greater than the critical angle will also be totally internally reflected. By varying the angle of impingement of the light between the perpendicular and the critical angle, the amount of emergent light can be varied from a maximum value to zero, respectively. This behavior is expected for situations where the facet is large compared to the wavelength of light. For the single lateral mode lasers of FIG. 2, the facet is comparable in size to the wavelength of light and the behavior of incident light will deviate from the large facet analysis, although the large facet analysis will still be a good approximation to the actual behavior. For the purpose of illustration, it will be assumed that the behavior of small facet lasers is the same as the behavior of large facet lasers.

In the device of FIG. 1, the facets 28 and 32 at the junctions 20 and 24, respectively, receive the light indicated by arrows 36 and 38 at angles 40 and 42, respectively, for the counterclockwise and clockwise light, which are angles greater than the critical angle for the corresponding facets. Accordingly, the facet 28 and its opposite facet 32 are both totally internally reflective. On the other hand, the facets 30 and 34 receive impinging light at less than the critical angle so that a certain percentage of light is emitted from facet 30, as indicated by arrow 44, and similarly a percentage of the impinging light on facet 34 is emitted, as indicated by arrow 46. The arrows 44 and 46 represent light emitted as a result of travelling wave moving in a counterclockwise direction in the laser 10. It will be understood that light travelling in a clockwise direction will also be partially emitted at the facets 30 and 34, as illustrated by the arrows 44' and 46'.

The exact angle at which the light strikes the partially transmissive and partially reflective facets 30 and 34 is dependent upon the shape of the laser 10 and thus upon the angles between adjacent legs. The selected angle can be chosen to optimize the laser performance, including the threshold current density of the lasers, the quantum efficiency of the lasers, and the intensity of laser light output needed at each facet; however, optimization of one of the foregoing criteria may be at the expense of another. An additional factor in the optimization of laser operation is the cavity length between adjacent partially reflective facets, with the shorter lengths providing fastest speeds of operation, although at the expense of threshold current density.

In order to facilitate the use of laser 10 as a logic device a direction of propagation is imposed on it to cause the laser to favor light travelling in one direction over the other so that a unidirectional semiconductor ring laser with a known direction of propagation is obtained. Such behavior can be forced by placing a reflector such as an external facet perpendicular to the path of emergence corresponding to a first of its two possible directions of propagation. Any potential light corresponding to this direction of propagation would be partially reflected back into the laser structure with a direction corresponding to the second direction of propagation. Since the semiconductor laser is of the single lateral mode kind, it will support only one direction of propagation, and this direction will be the second direction of propagation since the external facet makes operation in this direction more favorable.

Figure 3:
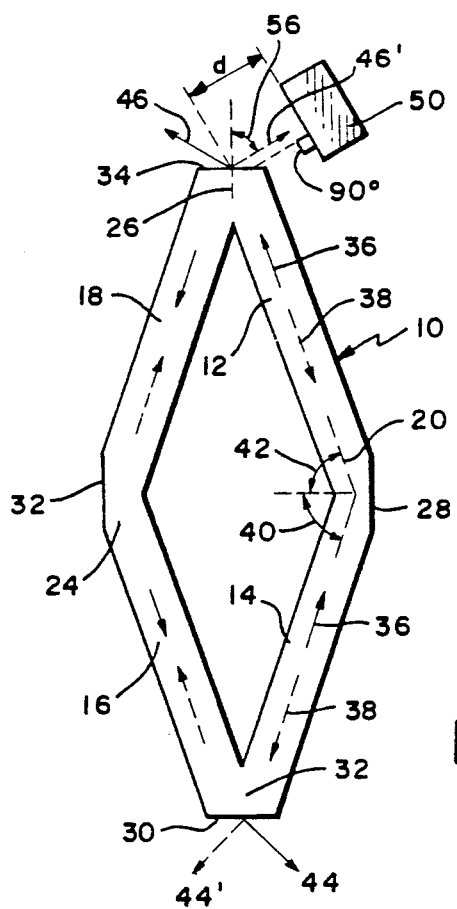
FIG. 3 illustrates the direction of propagation of light in a semiconductor ring laser segment having an external passive element such as a reflective facet forcing light in a particular direction of propagation.

FIG. 3 illustrates the situation where an external facet 50 is positioned so that it is perpendicular to the path of emergence 46'. This will cause any potential light emerging along the path of 46', corresponding to the clockwise direction of propagation, to be partially reflected back in a direction opposite to the direction of emergence, and thus opposite to direction 46'. The reflected light is directed back into the laser, but with a direction of propagation corresponding to the counterclockwise direction. This will favor operation of laser 10 in a counter clockwise direction and, since, laser 10 is a single lateral mode device, the counterclockwise direction of propagation will be the only direction of propagation. As a result, light indicated by the arrows 44 and 46 will be emitted.

The reflective facet 50 is spaced a distance d away from the facet 34, and this distance determines how strongly the light will be propagated in the desired direction. The reflectivity of facet 50 is a periodic function of the distance d, having a periodicity equal to one-half the wavelength of the laser light in the medium outside the laser. The reflectivity has maximas at values of d equal to one-half the wavelength of the laser light propagating in the medium outside the semiconductor laser or a whole number, m, multiple thereof. The maximas of the reflectivity become smaller as m becomes larger since the beam is spreading out due to diffraction. The reflectivity has minimas when the distance d is equal to one-quarter the wavelength of the laser light propagating in the medium outside the laser and additions thereto whole number multiples of one-half the wavelength of the laser light in the medium outside the laser. The positioning of the reflective facet 50 thus determines the degree to which it is more favorable for laser 10 to operate in the counterclockwise direction.

For the case where the external facet 50 is not positioned exactly perpendicular to the path of emergency 46', the effective reflectivity is lower compared with the case where the external facet 50 is positioned exactly perpendicular to the path of emergency 46'.

The length of the external reflective facet 50 which faces the path of emergency 46' also affects the reflectivity. The reflectivity is also affected if instead of a planar facet 50 a curved structure is used.

Another method of forcing a semiconductor ring laser into a particular direction of propagation is through the use of injection-locking, where laser light is injected into the ring laser. Examples of the three different injection-locking techniques are illustrated in FIGS.

Figure 4A:
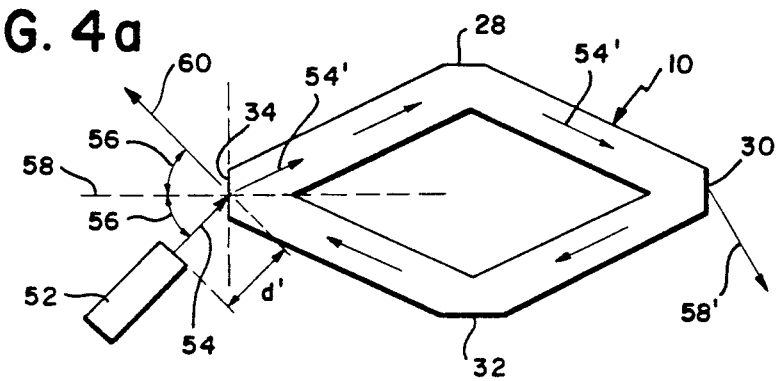
FIGS. 4a and 4b illustrate the directions of propagation of light in a semiconductor ring laser segment wherein light is forced into a particular direction of propagation through the injection of light from an external source such as (a) a rectangular laser, and (b) a waveguide.

4a, 4b and 5. In FIG. 4a, a rectangular laser 52 directs light 54 onto the facet 34 of ring laser 10 at an angle corresponding to the emergency angle 56 of that facet. A percentage of this laser light 54 is coupled into the laser structure 10 and propagates in the clockwise direction as indicated at 54'. The exact percentage of the incident light which is coupled into the laser is dependent on the incidence angle of light 54 to the facet 34 or with respect to its emergency angle. The percentage of the incident light which is coupled into the laser will be another parameter in the choice of the incidence angle to the facet 34 for the ring laser 10. The source 52 is spaced a distance d' from the center line 58 of facet 34 and the distance is still another parameter which affects the coupling of the beam 54 into the laser in the manner described above with the respect to FIG. 3 for the reflected light. The light propagating in the clockwise direction in laser 10 is emitted from facet 34 at the emergency angle 56 as an emergent light beam 60, and from facet 30 as emergent light beam 58'.

Figure 4B:
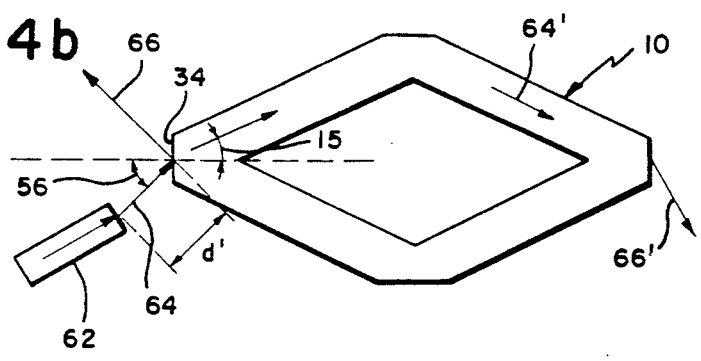

Behavior similar to that of FIG. 4a is illustrated in FIG. 4b, where the source of the injection/locking laser light is a waveguide 62 spaced a distance d' from facet 34 of laser 10. The waveguide functions generally in the manner of source 52 in FIG. 4a, and supplies incident light 64 to the facet 34 at an angle of incidence 56. Light 64 is coupled into laser 10 in the manner previously described, as illustrated by arrows 64', and light is emitted facets 34 and 30 as indicated by emergent light paths 60 and 66'.

Figure 5:
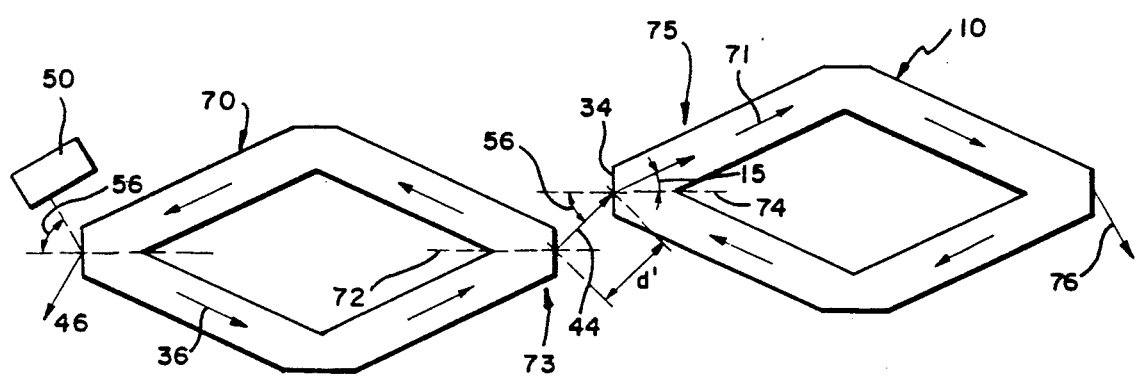
FIG. 5 illustrates the direction of propagation of light in a semiconductor ring laser which is forced into a particular direction of propagation through the injection of light from a semiconductor ring laser.

FIG. 5 illustrates the situation where the ring laser 10 is injection-locked by the output light from a prior ring laser 70 such as that illustrated in FIG. 3. Thus, the laser 70 includes a reflective facet 50, by means of which light is propagated in laser 70 in a counterwise direction, indicated by arrows 36, as explained hereinabove with respect to FIG. 3. Emergent light 44 from laser 70 is directed to facet 34 of laser 10 at the angle of emergency 56 of facet 34, and the light coupled into laser 10 causes the propagation in laser 10 to be favored in the direction of the incident beam, in this case in the clockwise direction indicated by arrows 71. The coupling is controlled by, among other things, the distance d' between the center line 72 of the outlet end 73 of laser 70 and the center line 74 of the inlet end 75 of laser 10, as previously explained, and for a single lateral mode ring laser that is injection-locked, the favored direction of propagation will be the only direction of propagation. An emergent beam 76 is provided by the laser 10.

Figure 6:
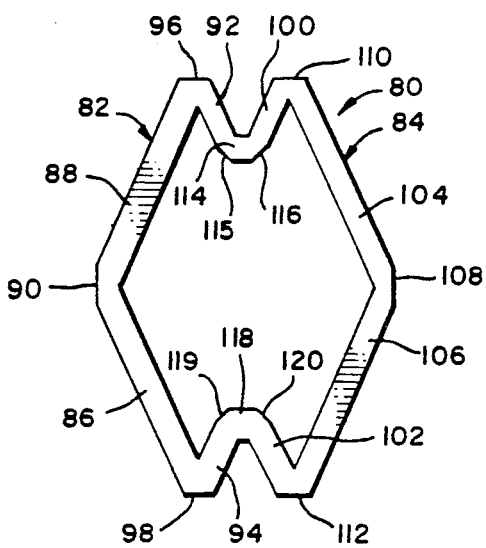
FIG. 6 illustrates a two-segment semiconductor ring laser.

In order to perform certain logic functions and to obtained a controllable light output which is of sufficient intensity to control a multiplicity of downstream logic elements, the present invention contemplates the provision of multi-segment bidirectional ring lasers. These are produced by joining a plurality of one segment laser so that light propagating in a first segment is directed into a second segment. The connection between the segments is made in a unitary manner, as by means of a monolithic construction so that light propagated in one segment is directed into the next adjacent segment without leaving the laser structure. FIG. 6 illustrates a multi-segment bidirectional ring laser constructed in accordance with the present invention and joining two single segment lasers of the type illustrated in FIG. 1. The multi-segment ring is generally indicated at 80 in FIG. 6 and includes a first segment 82 joined to a second segment 84. Segment 82 includes a first pair of cavity legs 86 and 88 joined at an internally reflective facet 90 and a second pair of cavity leg sections 92 and 94. Sections 88 and 92 are joined at a partially transmissive facet 96, while legs 86 and 94 are joined at a partially transmissive facet 98. As illustrated, the junction of laser legs 92 and 94 is eliminated and these legs are joined to corresponding legs 100 and 102 of the second segment 84. The second segment 84 is closed by two legs 104 and 106 which are joined at an internally reflective facet 108, with legs 100 and 104 being joined at a partially transmissive facet 110 and legs 102 and 106 being joined at a partially transmissive facet 112. Legs 92 and 100 are connected to a connecting leg 114 through total internal reflectors 115 and 116, respectively. Similarly, legs 94 and 102 are connected to a connecting leg 118 through total internal reflectors 119 and 120, respectively. By virtue of the unitary junctions between the various adjacent legs, and the connecting legs between the two segments 82 and 84, light can propagate around the closed two-segment ring illustrated in FIG. 6.

As illustrated, each segment has a plurality of cavity legs joined at angled junctions to form at least part of a ring and each segment includes at least one light transmissive, or exit, facet and at least one internally reflective facet at corresponding junctions. If the ring laser of the invention includes only one segment, the legs of that segment are all joined to form a closed ring, in the manner illustrated in FIG. 1. If the device is a multi-segment ring laser, then a pair of legs forming an internally reflective junction for a first ring are connected to legs forming an internally reflective junction for a second ring, with the junctions being omitted in each so that light propagated in one segment travels through connector legs into the other segment. The light-emitting facets for each segment are retained so that if a single segment ring laser has two light transmissive facets, then a two-segment laser will have four transmissive facets, a three segment laser will have six transmissive facets, and so on, with the joined segments forming a closed, multi-segment propagating light path.

Figure 7:
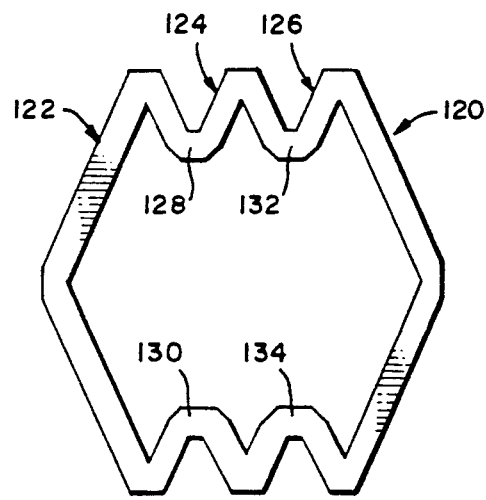
FIG. 7 illustrates a three-segment semiconductor ring laser.

FIG. 7 illustrates a three-segment bidirectional ring laser generally indicated at 120 and including segments 122, 124 and 126. As there illustrated, the segment 122 is joined to the segment 124 by means of connecting legs 128 and 130 in the manner described with respect to FIG. 6. In similar manner, the segment 124 is joined to the segment 126 by means of connecting legs 132 and 134. If desired, additional segments may be added in a similar manner to provide as many segments as desired.

Figure 8:
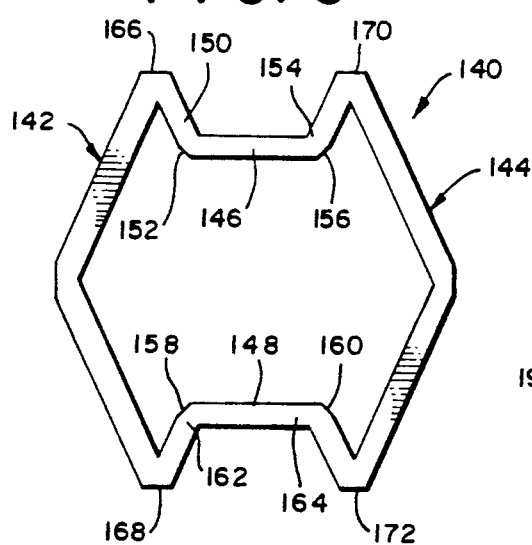
FIG. 8 illustrates a two-segment semiconductor ring laser modified to produce equal cavity distances between two adjacent partially reflective facets.

As illustrated in FIG. 8, the design of the multi-segment bidirectional ring laser is enhanced by ensuring that light losses within the laser are kept as uniformly spread out in the cavity as is possible. This is accomplished in the manner illustrated in FIG. 8 by adjusting the length of the connecting legs between adjacent segments to insure that the distance between adjacent partially light emitting facets will be equal to provide a more uniform intensity of emergent laser light from the partially reflective facets. Thus, in the two-segment laser 140 illustrated in FIG. 8, a first segment 142 is connected to a second segment 144 by means of connecting legs 146 and 148. Leg 146 is connected to segment 142 at a junction 150 which includes an internally reflective facet 152, while leg 146 is connected at its opposite end to segment 144 at a junction 154 which includes a totally internally reflective facet 156. In similar manner, the leg 148 connects the segments 142 and 144 through totally internally reflective facets 158 and 160 at junctions 162 and 164, respectively. The segment 142 includes partially transmissive facets 166 and 168 from which laser light is emitted in accordance with the angle of incidence to these facets. In similar manner, segment 144 includes light emitting exit facets 170 and 172 which emit light in accordance with the angle of incidence to these facets. The length of connecting legs 146 and 148 is adjusted so that the distance along the cavities between facets 166 and 170 is the same as the distance between facets 168 and 172, and these distances are the same as the distances between facets 166 and 168 and between 170 and 172.

Figure 9:
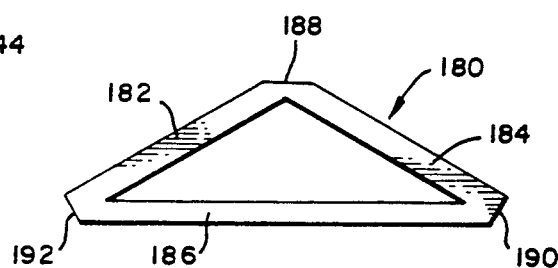
FIGS. 9, 10 and 11 illustrate modified semiconductor ring lasers for use in multiple laser logic elements.

FIG. 9 illustrates a generally triangular laser segment 180 which includes cavity legs 182, 184, and 186 joined unitarily with a totally internally reflective facet between legs 182 and 184 and partially transmissive facets 190 and 192 joining legs 184, 186 and 186, 182, respectively. This laser may also be joined in a multi-segment arrangement, for example, by breaking open the ring at the junction of legs 182 and 184 and connecting those two legs to corresponding legs on a mirror image of the ring laser 180 to provide a second pair of partially transmissive facets on a second segment.

Figure 10:
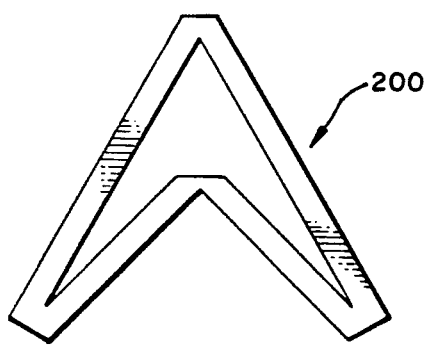
Figure 11:
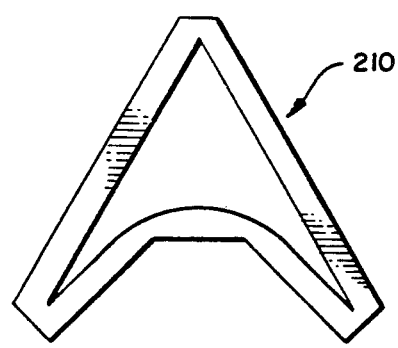

FIGS. 10 and 11 illustrate modifications of the triangular laser 180, the laser segment 200 in FIG. 10 utilizing four legs to provide a generally triangular closed ring laser and the segment 210 of FIG. 11 illustrating a five-legged generally triangular segment.

The single and multi-segment lasers described above are, in accordance with the present invention, utilized as optical logic components in the manner illustrated in FIGS. 12 through 16. FIG. 12 demonstrates the use of a single segment ring laser as a NOT logic element 220. A control signal in the form of incident light indicated by arrow 222 is directed onto a facet 224 at an incidence angle equivalent to the emergency angle of laser light from that facet. The facet 224 is partially transmissive at the angle of incidence so that a part of the incident light 22 is injected, or coupled, into the laser, as illustrated by arrow 226. A reflective facet 228 is positioned adjacent facet 224 to cause light to propagate in a counterclockwise direction, in the manner described with respect to FIG. 3. Input control beam 222 is of sufficient intensity that light propagated in the laser 220 is injection-locked to flow in a clockwise direction in the presence of the incident beam 222. In the absence of beam 222, the reflective facet 228 controls, and produces unidirectional operation in a counterclockwise direction as indicated by arrow 230. Injection locking by beam 222 overcomes the tendency of the reflective facet 228 to produce counterclockwise propagation. The distance, d, between the reflective facet 228 and the center of the transmitting facet 224 determines the extent to which it is more favorable for the ring laser to be operating in a counterclockwise direction. In a manner similar to that discussed in FIG. 3, the reflectivity of any incident light on the reflective facet 228 is a periodic function of d, having a periodicity of one-half the wavelength of the laser light in the medium outside the laser. To ensure that most of the incident beam 222 is coupled directly through facet 224 and not reflected from facet 224 and back reflected from reflective facet 228, the internal incidence angle to facet 222 and the distance d is manipulated accordingly.

The laser 220 includes cavity legs 232, 234, 236 and 238 which form a closed path in the manner discussed above, with legs 234 and 236 intersecting at junction 240 which incorporates at least partially transmissive facet 242. During operation of the laser, light propagating in either direction in the laser 220 strikes the facet 242 at less than the critical angle so that at least part of the light is emitted in the form of emergent, or exit beams 244 or 246. The beam 244 is produced by light propagating in a clockwise direction, corresponding to the predominant direction of propagation produced by the presence of the injection locking beam 222, while output 246 is produced by the counterclockwise propagation produced in the absence of the beam 222 and resulting from the unidirectional propagation produced by the reflective facet 228. Thus, if the input beam 222 is identified as signal A, the output beam 244 is designated Y and the output beam 246 is designated Y', then the following logic table representing the operation of the laser segment 220 shows that Y' is demonstrating the NOT logic function while Y=A:

TABLE I

| A | Y | Y' |
|---|---|----|
| 0 | 0 | 1 |
| 1 | 1 | 0 | where 0 represents the absence of laser light and 1 represents the presence of laser light. In this operation, the laser 220 is constantly energized by the application of voltage across its opposed surfaces in the manner described above, and the input signal 222 is turned on or off to change the direction of the output from Y to Y', without switching the laser off.

The logic function of the two-segment logic element 80 of FIG. 6 is illustrated in FIG. 13. In this case, a NOR logic function is provided by injecting light from a pair of sources labelled A and B in FIG. 13 and illustrated by arrows 250 and 252, respectively. A reflective facet 254 is provided adjacent facet 110 in the manner described with respect to FIG. 3. The intensity of either input 205 or input 252 is sufficient to produce unidirectional propagation in a clockwise direction in the two-segment element 80, as illustrated by arrows 256, while in the absence of both of the inputs 250 and 252, the reflective facet 254 will produce unidirectional propagation in the counterclockwise direction, as illustrated by arrows 258. Propagated light emerges from facets 98 and 112 in the directions indicated by arrows Y and Y'. The emergent light in the direction Y indicated by arrows 260 and 262 is produced by clockwise propagation in the presence of input signals 250 or 252, while the emergent light Y', indicated by arrows 264 and 266, is present during unidirectional propagation in the directions of arrows 258 when neither input 250 nor input 252 is present. This arrangement produces the NOR logic of Table II, as follows:

TABLE II

| A | B | Y | Y' |
|---|---|---|----|
| 0 | 0 | 0 | 1 |
| 0 | 1 | 1 | 0 |
| 1 | 0 | 1 | 0 |
| 1 | 1 | 1 | 0 | where the output Y represents an OR function and the output Y' represents the NOR function.

FIG. 14 represents a simple or optical logic gate utilizing a single segment such as the segment 220 but with two input signals instead of one. As there illustrated, a reflective facet 228 is provided adjacent facet 224 and an input signal 222 is available at that facet. A second input 270 is provided at facet 242 and provides the logic input B for this logic gate. Emergent beam 272 is provided at facet 242 and provides the Y function. In this device, the presence of either a signal 222 at facet 224 or a signal 270 at facet 242 produces a clockwise unidirectional propagation illustrated by arrows 274 and 276, both of which result in an output in the direction of arrow 272 and identified as Y. Thus, the logic OR function is provided in accordance with the following Table:

TABLE III

| A | B | Y |
|---|---|---|
| 0 | 0 | 0 |
| 0 | 1 | 1 |
| 1 | 0 | 1 |
| 1 | 1 | 1 |

When neither of the input beams 222 and 270 are present, the reflective facet 228 forces the counterclockwise operation of the laser indicated by arrow 278.

FIG. 15 provides the NAND and AND optical logic functions through the use of the two-segment ring laser element 80. In this case, however, the input signals 250 and 252 individually are insufficient to produce unidirectional propagation in the ring laser 80. Accordingly, these signals are indicated by the designations A' and B'. This reduced intensity is produced, for example, by carefully positioning the incoming input beam sources, such as those described in FIGS. 4 and 5, so that the power of one of the injection-locked input beams will be insufficient to overcome the capability of the reflective facet 254 to produce unidirectional propagation in the counterclockwise direction. Accordingly, during operation of laser 80, the mirror 254 will produce unidirectional counterclockwise operation, in the direction indicated by arrows 258 unless both the signals A' and B' are present. In the latter case, light will be propagated in the clockwise direction, as indicated by the arrows 256. This may be accomplished by positioning the input beam sources at a distance d' away from the corresponding facets 96 and 110 so as to reduce the intensity of the light transmitted into the body of laser 80 and by adjusting the distance d at which the reflective facet 254 is positioned away from facet 110. Accordingly, the optical gate illustrated in FIG. 15 will produce the logic functions indicated in the following Table:

TABLE IV

| A' | B' | Y | Y' |
|----|----|----|----|
| 0 | 0 | 0 | 1 |
| 0 | 1 | 0 | 1 |
| 1 | 0 | 0 | 1 |
| 1 | 1 | 1 | 0 | where Y represents the AND function and Y' represents the NAND function.

The emergent light from any one of the logic elements discussed above may be used as the input for a following logic element to provide additional logic functions or, as illustrated in FIG. 16, may be connected in a ring 280. As there illustrated, the elements 180 of FIG. 9 may be connected so that the facet 190 at one end of a first element is adjacent the facet 192 of a next adjacent element. An odd number of such elements are connected in a circle so that with all of the elements activated to produce lasing, the light propagating in each element is partially transmitted to the next, and in turn each element receives light energy from the next preceding element in the ring so as to form a ring oscillator.

Figure 17A:
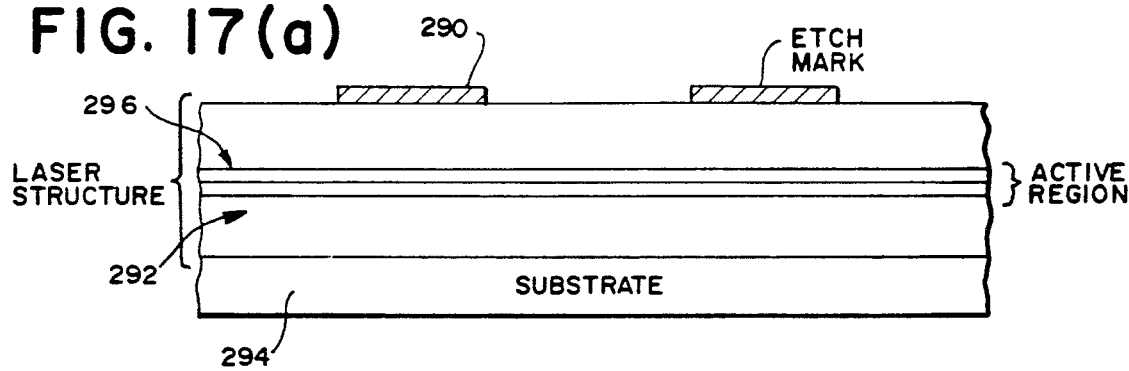
Figure 17B:
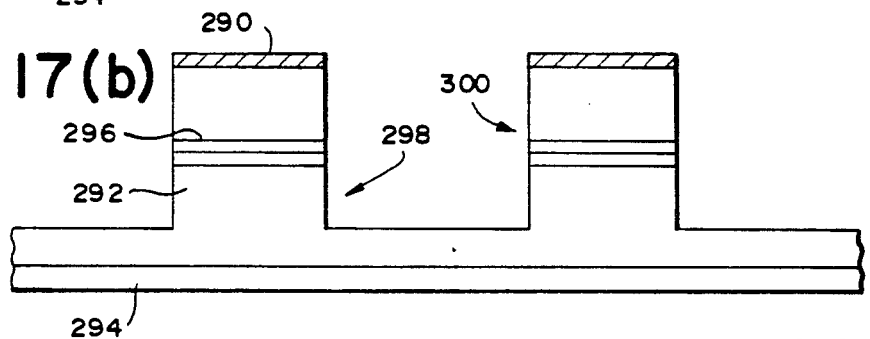
Figure 17C:
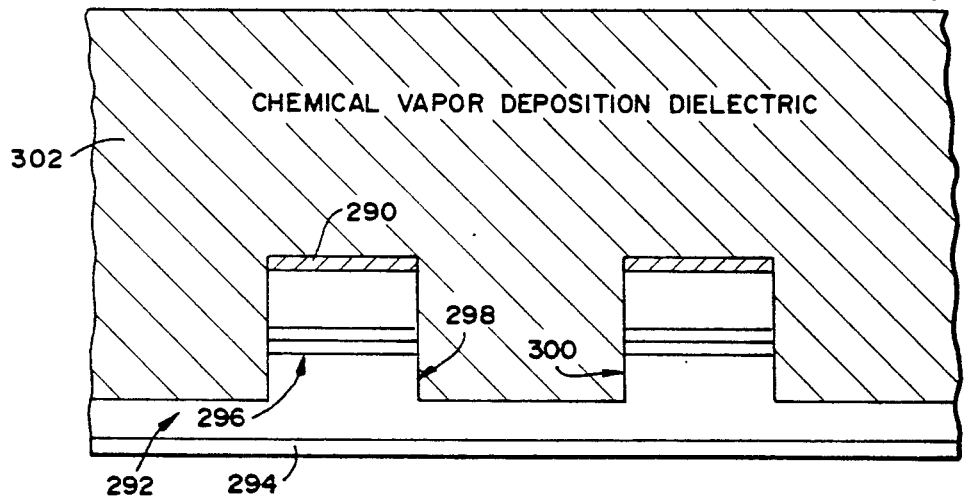
Figure 17D:
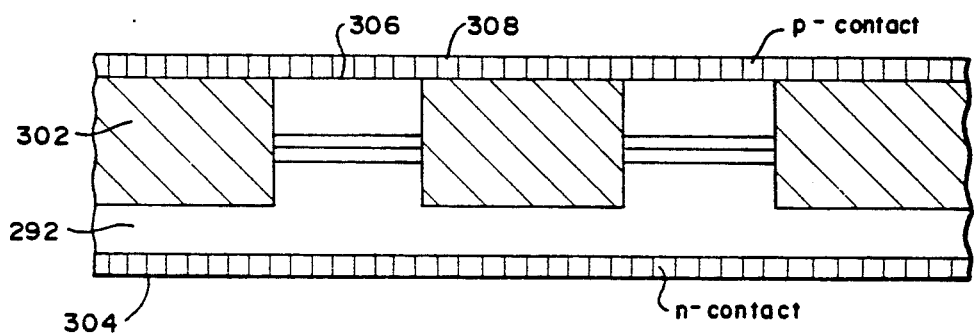

FIGS. 17a-17d illustrate the key steps in fabricating narrow-width lasers. In FIG. 17a, an etch mask 290 is formed through conventional metallization lift-off or reactive ion etching of a dielectric after lithographic definition. The etch mask is so formed on a conventional semiconductor laser 292 carried on a substrate 294, the laser structure incorporating an active region 296, and defines a laser structure such as that illustrated in FIGS. 2a or 2b. As illustrated in FIG. 17(b), the pattern of the mask 290 is transferred to the laser structure by the use of chemically assisted ion beam etching or reactive ion beam etching to form, for example, laser sections 298 and 300, and the structure is planarized (FIG. 17(c)) by the vapor deposition of a dielectric 302. Thereafter, an n-contact 304 is deposited on the bottom of the laser structure 292 and is annealed. The dielectric layer 302 and the mask 290 are etched back to the level of the top surface 306 of the laser structure, a p-contact layer 308 is deposited on the top of the laser structure, and layer 308 is annealed to complete the formation of the narrow-width laser.

Thus, there has been provided in accordance with the present invention optical logic elements which utilize semiconductor ring lasers wherein the direction of propagation of the light within a ring is controlled by an external controller to produce corresponding emergent light signals representing predetermined logical functions. Although the invention has been described in terms of preferred embodiments, it will be apparent that variations and modifications may be made without departing from the true spirit and scope thereof.

What is claimed is:

1. A method of forming an optical logical element, comprising:
    forming a unitary, semiconductor ring laser with a plurality of interconnected cavity legs joined at corresponding ends to form a closed path for light propagating in either a first or a second direction;
    forming facet means integral with each juncture of adjacent cavity legs, each facet means having a critical angle;
    causing at least two of said facet means to be partially transmissive to light propagating in either of said first and second directions in said ring laser to produce first and second emergent light beams corresponding to said first and second directions of propagation at each of said at least two facets; and
    selectively producing unidirectional propagation of light in said laser to thereby control the direction of emergent light from at least one of said at least two facets.

2. The method of claim 1, wherein the step of selectively producing unidirectional propagation of light includes supplying a control beam of light to one of said partially transmissive facet means to thereby control the direction of emergent light from the other of said partially transmissive facet means.

3. The method of claim 1, wherein the step of forming a unitary semiconductor ring laser includes:
    forming on a substrate a laser structure having an upper layer, a lower layer on the substrate, and an intermediate active region;
    defining on said upper surface by means of an etch mask a ring laser structure;

transferring the etch mask pattern to the laser structure to produce a ring laser of selected shape having a plurality of unitary, interconnected cavity legs and facets at the junctures of adjacent legs;

planarizing the top of the ring laser by vapor deposition of a dielectric;

depositing an N-contact on the bottom of the lower layer of the laser structure;

etching the dielectric layer and the etch mask to expose the top surface of the upper layer of the layer structure; and depositing a p-contact layer on the exposed top surface.

4. An optical logic method, comprising:

forming a multisegment semiconductor ring laser having light outputs;

causing light to propagate in said ring laser; and controlling the direction of progagation of said light within said ring laser to provide a unidirectional light output representing a logic function.

5. The method of claim 4, wherein the step of controlling the direction of propagation includes injecting light from a control light source into said ring laser.

6. The method of claim 4, wherein the step of controlling the direction of propagation includes reflecting light from one of said ring laser light outputs back into said ring laser.

7. The method of claim 4, wherein the step of controlling the direction of propagation includes injecting light from an output of a first segment of said multisegment semiconductor ring laser having light propagating in a controlled direction into a second segment of said multisegment ring laser, said first and second ring laser segments forming a logic element.

8. An optical logic element, comprising:

a unitary semiconductor ring laser having a plurality of cavity legs and forming a closed path;

first and second light outlets for said ring laser;

means causing light to propagate in said ring laser; and means producing unidirectional propagation of light within said ring laser to produce emergent light at a selected one of said light outlets.

9. The optical logic element of claim 8, wherein said means producing unidirectional propagation of light comprises means injecting control light into said ring laser.

10. The optical logic element of claim 9, wherein said means injecting control light comprises a second ring laser propagating light unidirectionally in a predetermined direction.

11. The optical logic element of claim 8, wherein said means producing unidirectional progagation of light comprises reflector means at a second one of said light outlets for returning light emergent from said second outlet to said ring laser.

12. An optical logic method, comprising:

forming a plurality of single-segment semiconductor ring lasers, each having a light input and a light output;

arranging said single-segment semiconductor ring lasers in optical communication with each other, whereby the light output from a selected ring laser provides the light input to another ring laser to thereby provide an optical logic array;

causing light to propagate in each said single-segment ring laser; and controlling the direction of propagation of said light in each of said plurality of single segment lasers to thereby provide a light output representing a logic function from said optical logic array.

13. The method of claim 12, wherein said step of controlling the direction of propagation of light comprises injecting light from a control light source into at least a first of said plurality of single segment lasers.

14. The method of claim 13, wherein said step of controlling the direction of propagation of light includes directing output light from first selected single segment lasers for injection as input light into second selected single segment lenses.

15. The method of claim 12, wherein the step of arranging said single-segment semiconductor ring lasers comprises positioning lasers in sequence whereby output light from a preceding ring laser constitutes the input light to a next successive ring lasers.

16. The method of claim 5, wherein the step of controlling the direction of propagation of light comprises injecting light from a control source into at least a first of said sequence of ring lasers, and comprises injecting output light from a preceding ring laser into at least a second of said sequence of ring lasers.

* * * * *